(12) United States Patent
Jang et al.

(10) Patent No.: US 10,418,583 B2
(45) Date of Patent: Sep. 17, 2019

(54) ORGANIC LIGHT EMITTING DEVICE

(71) Applicant: LG Display Co., Ltd., Seoul (KR)

(72) Inventors: Jihyang Jang, Goyang-si (KR);
Sookang Kim, Paju-si (KR); Soyoung Jo, Seoul (KR); Wonhoe Koo, Goyang-si (KR); Hyunsoo Lim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 59 days.

(21) Appl. No.: 15/444,198

(22) Filed: Feb. 27, 2017

(65) Prior Publication Data

US 2018/0247980 A1  Aug. 30, 2018

(51) Int. Cl.
*H01L 27/32* (2006.01)
*H01L 51/52* (2006.01)

(52) U.S. Cl.
CPC ...... *H01L 51/5209* (2013.01); *H01L 27/3258* (2013.01); *H01L 51/5281* (2013.01); *H01L 27/322* (2013.01)

(58) Field of Classification Search
CPC . H01L 27/322; H01L 27/326; H01L 27/3276; H01L 51/5203; H01L 51/5262
See application file for complete search history.

(56) References Cited

U.S. PATENT DOCUMENTS

| 4,774,435 | A * | 9/1988 | Levinson | H05B 33/12 313/509 |
| 6,288,388 | B1 * | 9/2001 | Zhang | H01L 27/14603 136/249 |

| 2002/0192576 | A1 | 12/2002 | Matsuoka et al. |
| 2008/0024402 | A1 * | 1/2008 | Nishikawa | H01L 51/5209 345/82 |
| 2008/0122347 | A1 | 5/2008 | Lee |
| 2008/0237764 | A1 | 10/2008 | Kikuchi |
| 2012/0132897 | A1 | 5/2012 | Seki et al. |
| 2012/0223314 | A1 | 9/2012 | Marks et al. |
| 2013/0082247 | A1 * | 4/2013 | Kawata | H01L 51/5209 257/40 |
| 2013/0334507 | A1 | 12/2013 | Shimoji et al. |
| 2015/0179967 | A1 | 6/2015 | Hashimoto et al. |
| 2015/0179978 | A1 | 6/2015 | Sato |

(Continued)

FOREIGN PATENT DOCUMENTS

| DE | 102016116119 | 3/2017 |
| EP | 2455786 | 5/2012 |

(Continued)

OTHER PUBLICATIONS

Korean Office Action, Korean Application No. 10-2015-0123211, dated May 23, 2016, 5 pages. (with concise explanation of relevance).

(Continued)

*Primary Examiner* — Peniel M Gumedzoe
(74) *Attorney, Agent, or Firm* — Fenwick & West LLP

(57) ABSTRACT

Provided is an organic light emitting device including an overcoat layer on a substrate, a first electrode disposed on the overcoat layer, an organic light emitting layer disposed on the first electrode and including a convex or concave curve; and a second electrode disposed on the organic light emitting layer.

11 Claims, 19 Drawing Sheets

(56) References Cited

U.S. PATENT DOCUMENTS

| | | | |
|---|---|---|---|
| 2015/0380466 A1* | 12/2015 | Koo | ............... H01L 27/3258 257/40 |
| 2016/0172421 A1 | 6/2016 | Ando et al. | |
| 2016/0240588 A1 | 8/2016 | Yi | |
| 2016/0268351 A1* | 9/2016 | Wu | ............... H01L 27/3209 |
| 2017/0062769 A1 | 3/2017 | Kim et al. | |
| 2017/0062770 A1 | 3/2017 | Jang et al. | |
| 2017/0084676 A1 | 3/2017 | Jang et al. | |
| 2017/0155094 A1 | 6/2017 | Joung et al. | |
| 2017/0162819 A1 | 6/2017 | Huang | |

FOREIGN PATENT DOCUMENTS

| | | |
|---|---|---|
| GB | 2544900 | 5/2017 |
| JP | P2006-164808 A | 6/2006 |
| WO | WO 2017020361 | 2/2017 |

OTHER PUBLICATIONS

Bae, J-H., et al., "Transparent, Low Resistance, and Flexible Amorphous ZnO-Doped $In_2O_3$ Anode Grown on a PES Substrate," Journal of the Electrochemical Society, 2007, pp. J81-J85, vol. 154, No. 3.

United States Office Action, U.S. Appl. No. 16/212,459, dated Aug. 8, 2019, nine pages.

\* cited by examiner

ORGANIC LIGHT EMITTING DEVICE

BACKGROUND

1. Field

The disclosure relates to an organic light emitting device.

2. Description of the Related Art

An organic light emitting device, has advantages in that, by using a self-light emitting organic light emitting element, a response speed is high, a contrast ratio is high, a light emitting efficiency is high, and a viewing angle is wide.

Light emitted from an organic light emitting layer of the organic light emitting device passes through several components of the organic light emitting device to exit from the organic light emitting device. However, some light emitted from the organic light emitting layer does not exit the organic light emitting device, but is locked in the organic light emitting device. Therefore, the light extraction efficiency of the organic light emitting device becomes an issue. A method of attaching a Micro Lens Array (MLA) to the outside of a substrate of the organic light emitting device has been used in order to improve the light extraction efficiency of the organic light emitting device.

SUMMARY

The disclosure is to provide an organic light emitting device that improves an outward light emitting efficiency and reduces power consumption.

One embodiment may provide an organic light emitting device including an overcoat layer disposed on a substrate, a first electrode disposed on the overcoat layer; an organic light emitting layer disposed on the first electrode and including a convex or concave curve, and a second electrode disposed on the organic light emitting layer.

A region having the thinnest thickness in the organic light emitting layer may be located between the bottom and the top of the curve.

The overcoat layer may include a convex part or a concave part corresponding to the curve of the organic light emitting layer. The first electrode may also include a plurality of convex parts or a plurality of concav parts corresponding to a plurality of the curves of the organic light emitting layer.

In another embodiment, an organic light emitting device comprises a substrate, a first electrode, and an organic light emitting layer, and a second electrode disposed on the organic light emitting layer. The organic light emitting layer has a curvy shape including a plurality of convex regions or a plurality of concave regions. The organic light emitting layer in at least one of the convex regions or at least one of the concave regions is thinner at a point between and away from a bottom and a top of said one of the convex regions or concave regions than at the bottom or the top of said one of the convex regions or concave regions.

In still another embodiment, an organic light emitting device comprises an overcoat layer disposed on a substrate and including a plurality of convex parts or a plurality of concave parts, at least one of the convex parts of the concave parts having a Full Width at High Maximum ("FWHM") smaller than a radius of said at least one of the convex parts of the concave part, a first electrode disposed on the overcoat layer, an organic light emitting layer disposed on the first electrode, and a second electrode disposed on the organic light emitting layer. According to the embodiments as described above, it is possible to provide an organic light emitting device that is capable of improving an outward light emitting efficiency and reducing power consumption.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE EXEMPLARY EMBODIMENTS

Figure 1:
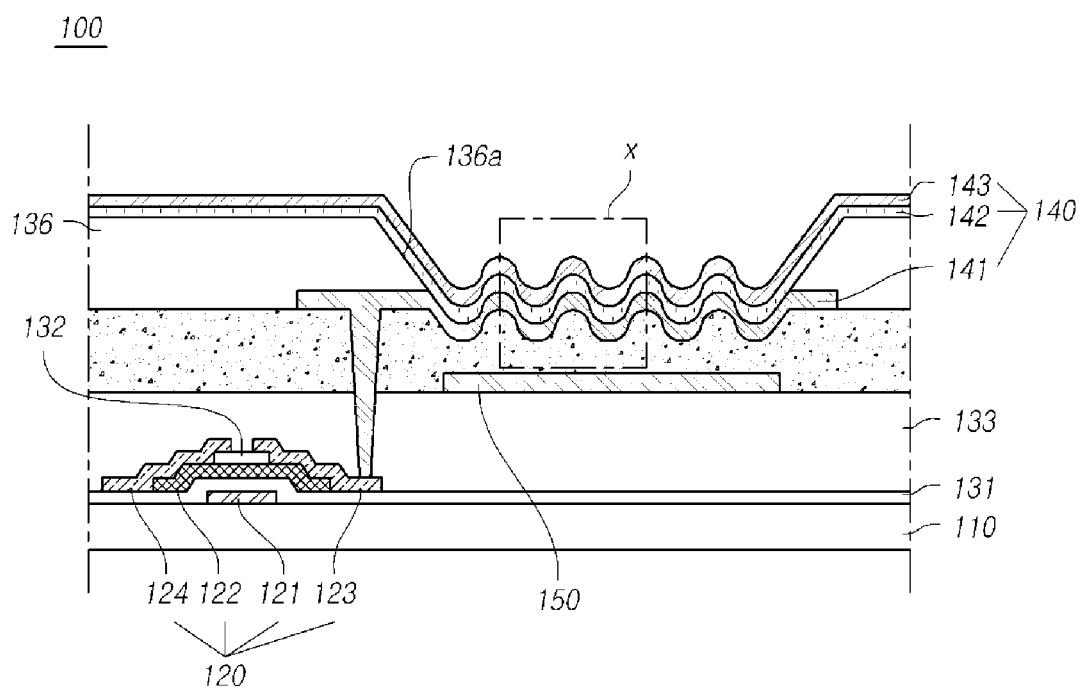
FIG. 1 is a cross-sectional view of an organic light emitting device according to one embodiment.

Hereinafter, some embodiments of the present invention will be described in detail with reference to the accompanying illustrative drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may be connected to", "be coupled to", or "be in contact with" the structural elements as well as that the certain structural element is directly connected to or is in direct contact with another structural element.

FIG. 1 is a cross-sectional view of an organic light emitting device according to one embodiment.

Referring to FIG. 1, an organic light emitting device 100 may be a variety of light emitting devices including an organic light emitting device or an organic electric element including two electrodes 141 and 143 and an organic light emitting layer 142 between the electrodes 141 and 143.

The organic light emitting device 100 may be one of an organic light emitting diode display device for displaying an image, a lighting device and a light source.

When the organic light emitting device 100 is the organic light emitting diode display device, it may be one of a bottom emission display device, a top emission display device, a dual emission display device, a flexible display device, and a transparent display device, but may be not limited thereto.

When the organic light emitting device 100 is the lighting device, it may be an indoor/outdoor lighting device, a vehicle lighting device, or the like and applied to the above-described lighting devices in combination with other equipments. For example, an automotive lighting device may at least one of a headlight, a high beam, a taillight, a brake light, a back-up light, a brake light, a fog lamp, a turn signal light, and an auxiliary lamp, but may be not limited thereto.

When the organic light emitting device 100 is the light source, it may be applied, for example, to a backlight of a liquid crystal display (LCD), a light source such as various sensors, a printer, and a copying machine, a vehicle instrument light source, a traffic light, a display light, a light source of a planar light-emitting body, a decoration, or various lights.

Hereinafter, the organic light emitting device 100 will be described as the organic light emitting display device, but the present invention is not limited thereto and may be the lighting device or the light source.

Figure 2A:
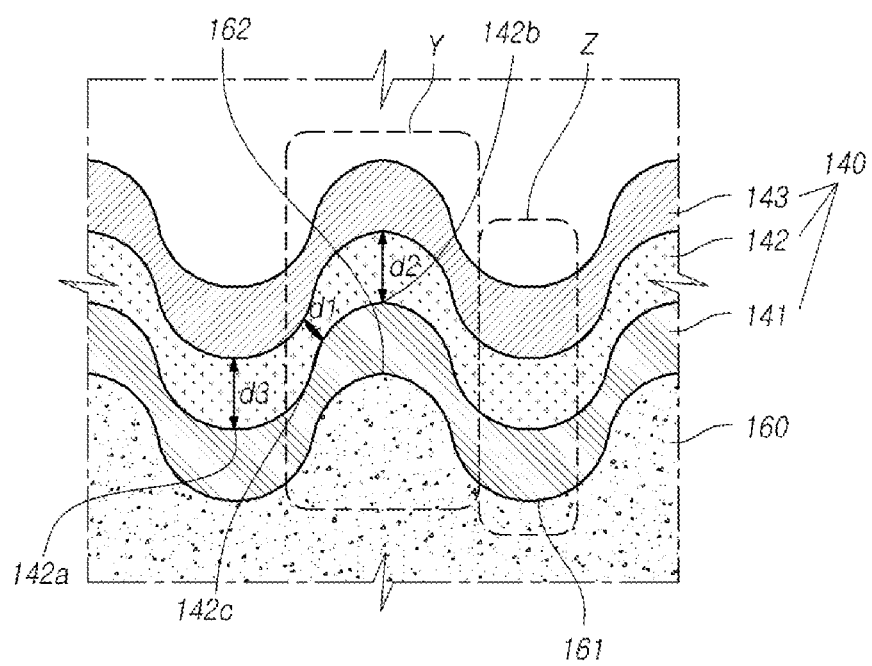
FIG. 2A is an enlarged cross-sectional view for the region "X" in FIG. 1.
Figure 2B:
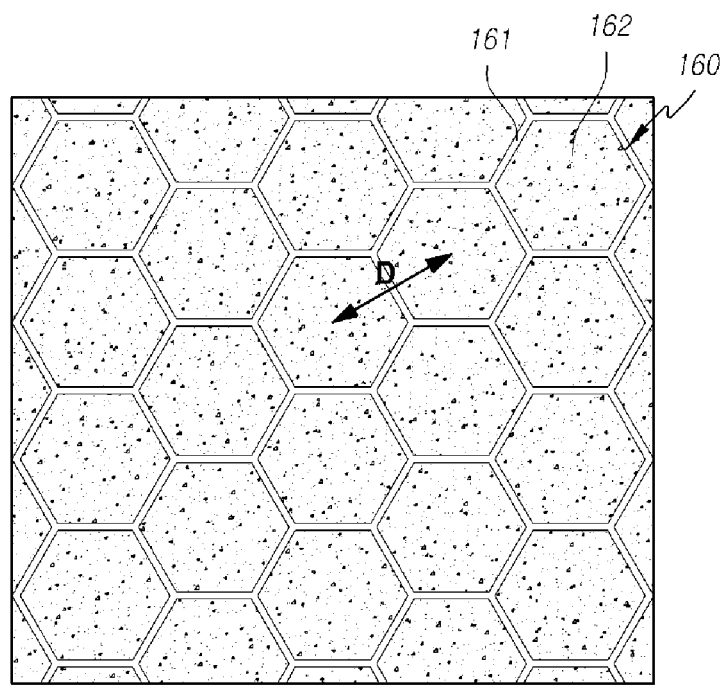
FIG. 2B is a partial plan view for a first electrode in the region "X" in FIG. 1.

FIG. 2A is an enlarged cross-sectional view for the region "X" in FIG. 1. FIG. 2B is a partial plan view for a first electrode in the region "X" in FIG. 1.

Referring to FIG. 1 and FIG. 2A, the organic light emitting device 100 may further include a thin film transistor 120, a color filter 150, and an overcoat layer 160 disposed on the substrate 110. The substrate is divided into an active area and a non-active area.

The organic light emitting device 100 illustrated in FIGS. 1 and 2A may be a bottom emission type organic light emitting device. However, the organic light emitting device 100 according to one embodiment may be a top emission type organic light emitting device in which a color filter 150 is positioned at an opposite side to the substrate 110.

On the substrate 110, the thin film transistor 120 is disposed, which includes a gate electrode 121, an active layer 122, a source electrode 123, and a drain electrode 124.

Specifically, the gate electrode 121 is disposed on the substrate 110, and a gate insulation layer 131 is disposed on the gate electrode 121 and the substrate 110 to insulate the gate electrode 121 and the active layer 122. The active layer 122 is disposed on the gate insulation layer 131, an etch stopper 132 is disposed on the active layer 122, and the source electrode 123 and the drain electrode 124 are disposed on the active layer 122 and the etch stopper 132. The source electrode 123 and the drain electrode 124 are electrically connected with the active layer 122 by contact with the active layer 122, and are disposed to partially overlap the etch stopper 132. Optionally, the etch stopper 132 may not be provided.

In this specification, among various thin film transistors, which may be included in the organic light emitting device 100, only a driving thin film transistor is illustrated for the convenience of description. Further, in this specification, it is described that the thin film transistor 120 is of an inverted staggered structure or a bottom gate structure in which the gate electrode 121 is positioned at the opposite side of the source electrode 123 and the drain electrode 124 with reference to the active layer 122. However, a thin film transistor of a coplanar structure or a top gate structure may also be used in which the gate electrode 121 is positioned at the same side as the source electrode 123 and the drain electrode 124 with reference to the active layer 122.

A passivation layer 133 is disposed on the thin film transistor 120, and a color filter 150 is disposed on the passivation layer 133.

While FIG. 1 illustrates that the passivation layer 133 flattens the top portion of the thin film transistor 120, the passivation layer 133 may be disposed following the surface shapes of the elements positioned therebelow, rather than flattening the top portion of the thin film transistor 120.

The color filter 150 is configured to convert light emitted from the organic light emitting layer 142, and may be one of a red color filter, a green color filter, and a blue color filter.

The color filter 150 is disposed at a portion corresponding to a light emitting region on the passivation layer 133. Here, the light emitting region refers to a region in which the organic light emitting layer 142 emits light by a first electrode 141 and a second electrode 143. The description, "the color filter 150 is disposed at a position corresponding to the light emitting region," means that the color filter 150 is disposed in order to suppress the occurrence of a blurring phenomenon and a ghost phenomenon that may be caused when lights emitted from adjacent light emitting regions are mixed.

For example, the color filter 150 is disposed to be superimposed on the light emitting region. Specifically the color filter 150 may have a size that is equal to or smaller than that of the light emitting region. However, the disposed position and size of the color filter 150 may be determined by various factors, such as a distance between the color filter 150 and the first electrode 141, and a distance between the color filter 150 and a convex part 162 of the overcoat layer 160, in addition to the size and position of the light emitting region.

The overcoat layer 160 is disposed on the color filter 150 and the passivation layer 133. While FIG. 2A illustrates that the passivation layer 133 is included in the organic light emitting device 100, the overcoat layer 160 layer may be directly disposed on the thin film transistor 120 without using the passivation layer 133. FIG. 2A illustrates that the color filter 150 is disposed on the passivation layer 133. Without being limited thereto, however, the color filter 150 may be disposed at an arbitrary position between the overcoat layer 160 and the substrate 110.

The overcoat layer 160 includes a plurality of convex parts 162 disposed to be superimposed on the color filter 150, and a plurality of first connection parts 161, each of which interconnects adjacent convex parts 162. FIG. 2A is a cross-sectional view of a plurality of hexagonal convex parts 162. The first connection part 161 is a high portion between each adjacent convex parts 162. The overcoat layer 160 functions as a flattening layer in an area where the plurality of convex parts 162 are not disposed.

As illustrated in FIG. 2B, each of the plurality of convex parts 162 and first connection parts 161 generally has a hexagonal shape in a plan view, but may have various shapes, such as a hemispheric shape, a hemiellipsoidal shape, and a quadrilateral shape without being limited thereto. The plurality of convex parts 162 may be arranged in a hexagonal honeycomb structure in a plan view. In other words, one hexagonal convex part 162 and another convex part 162 located adjacent thereto may share one side to be arranged in an integrally formed hexagonal honeycomb structure.

The organic light emitting diode 140, which includes the first electrode 141, the organic light emitting layer 142, and the second electrode 143, a bank 136 are disposed on the overcoat layer 160. In this case, although not illustrated, an insulative second passivation layer (not illustrated) may be added between the overcoat layer 160 and the first electrode 141 to block outgassing from the overcoat layer 160 from spreading to the organic light emitting diode 140, in which the second passivation layer has a shape that follows the morphology of the convex parts 162 of the overcoat layer 160 as it is, and has a refractive index that is similar to that of the first electrode 141.

Specifically, the first electrode 141 is disposed in a portion on the overcoat layer 160 to supply one of electron or hole to the organic light emitting layer 142. The first electrode 141 may be a positive pole, a pixel electrode, or an anode in a normal organic light emitting diode (OLED), and may be a negative pole, a pixel electrode, or a cathode in an inverted OLED.

The first electrode 141 may be connected to the source electrode 123 of the thin film transistor 120 through a contact hole formed in the overcoat layer 160 and the passivation layer 133. In this specification, it is described that the first electrode 141 is connected to the source electrode 123 assuming that the thin film transistor 120 is an N-type thin film transistor. However, when the thin film transistor 120 is a P-type thin film transistor, the first electrode 141 may be connected to the drain electrode 124. The first electrode 141 may be directly in contact with the organic light emitting layer 142, or may be in contact with the organic light emitting layer 142 with a conductive material being interposed therebetween so that the first electrode 141 is electrically connected to the organic light emitting layer 142.

The first electrode 141 is disposed in a shape that follows the morphology of the surface of the overcoat layer 160. Accordingly, the first electrode 141 has a convex morphology on the convex part 162 of the overcoat layer 160.

A bank 136 is disposed which includes an opening 136a that is disposed on the overcoat layer 160 and the first electrode 141 and exposes the first electrode 141. The bank 136 serves to separate adjacent pixel (or sub-pixel) regions, and may be disposed between adjacent pixel (sub-pixel) regions. The convex part 162 and the first connection part 161 of the overcoat layer 160 are disposed to be superimposed on the opening 136a of the bank 136. Because the convex part 162 and the first connection part 161 of the overcoat layer 160 are disposed to be superimposed on the color filter 150 as described above, the convex part 162 and the first connection part 161 of the overcoat layer 160 are superimposed on the color filter 150 therebelow and superimposed on the opening 136a of the bank 136 thereon.

The organic light emitting layer 142 is disposed on the first electrode 141, and the second electrode 143 is disposed on the organic light emitting layer 142 to supply one of electron or hole to the organic light emitting layer 142. The organic light emitting layer 142 is disposed in a tandem white structure in which a plurality of organic light emitting layers are stacked in order to emit white light. The organic light emitting layer 142 may include a first organic light emitting layer that emits blue light and a second organic light emitting layer that is disposed on the first organic light emitting layer and emits light having a color that becomes white when mixed with blue. The second organic light emitting layer may be an organic light emitting layer that emits, for example, yellow-green light. In the meantime, the organic light emitting layer 142 may only include an organic light emitting layer that emits one of blue light, red light, and green light. In this case, the color filter 150 may not be included. The second electrode 143 may be a negative pole, a common electrode, or a cathode in a normal organic light emitting diode (OLED), and may be a positive pole, a common electrode, or an anode in an inverted OLED.

Referring to FIG. 2A, the thickness of the organic light emitting layer 142 between the convex part 162 and the first connection part 161 of the overcoat layer 160 may be thinner than the thickness of the organic light emitting layer 142 on the bottom of the convex part 162 or the top of the first connection part 161 of the overcoat layer 160. In particular, the thickness of the organic light emitting layer 142 may be the smallest at a position where the slope of the organic light emitting layer 142 is the largest between the convex part 162 and the first connection part 161 of the overcoat layer 160.

For example, when the organic light emitting layer 142 is formed through a deposition method, the thickness of the organic light emitting layer 142 deposited in a direction perpendicular to the substrate 110 may be the same while the organic light emitting layer 142 may have a shape that follows the morphology of the overcoat layer 160.

Due to the characteristic of the deposition process, the thickness d1 of the organic light emitting layer 142, which is practically driven by the current between the first electrode 141 and the second electrode 143, is the thinnest at a position 142c where the slope of the organic light emitting layer 142 is the largest. The thickness d2, d3 of the organic light emitting layer 142, which is driven by the current between the first electrode 141 and the second electrode 143, is the thickest at a position such as a bottom 142a and a top 142b where the slope of the organic light emitting layer 142 is the smallest. In view of the light emission quantity of the organic light emitting layer 142 according to the thickness d1, d2, d3 of the organic light emitting layer 142, the light emission quantity per unit area of the organic light emitting layer 142 between the bottom 142a and the top 142b of the curve may be larger than that of the organic light emitting layer 142 on the bottom 142a or the top 142b of the curve. In particular, the light emission quantity of the organic light emitting layer 142 may be the largest at a position 142c where the slope of the organic light emitting layer 142 is the largest between the convex part 162 and the first connection part 161 of the overcoat layer 160. In one embodiment, d1 is a value of d2 reduced by 15%-50% or d3 reduced by 15%-50%. When d1 is d2 (or d3) reduced by less than 15%, light emission quantity is not enhanced significantly. On the other hand, when d1 is d2 (or d3) reduced by more than 50%, light emission quantity may be significantly enhanced but the organic light emitting layer 142 is so thin that the life of the organic light emitting device 100 may be deteriorated. Therefore, the organic light emitting layer 142 is made to have a thickness of d1 thinner than d2 or d3 by a modest amount (i.e., d2 or d3 reduced by 15%-50%) to achieve enhancement of light emission and life of the organic light emitting device at the same time.

The organic light emitting layer 142 and the second electrode 143 are disposed in a shape that follows the morphology of the top surface of the first electrode 141 that follows the morphology of the surface of the overcoat layer 160. Consequently, the shape of the organic light emitting diode 140 may be implemented using the convex part 162 of the overcoat layer 160.

When the organic light emitting diode 140 has a micro lens array structure for improving an external light extraction efficiency, due to a pattern characteristic, convex curves are exhibited on the surface of the organic light emitting diode 140 by the convex parts 162 of the overcoat layer 160 as illustrated in FIG. 2A. The thickness of the organic light emitting layer 142 between the bottom 142a and the top 142b of each curve may be thinner than that of the organic light emitting layer 142 on the bottom 142a or the top 142b of each curve.

In this case, as the thinnest thickness d1 of the organic light emitting layer 142 between the first electrode 141 and the second electrode 143 becomes thinner in a larger slope region, an efficient light emitting region Y where electric fields are locally concentrated, i.e. a region between the convex part 162 and the first connection part 161 of the overcoat layer 160 occurs. When the organic light emitting diode 140 is driven, electric fields are locally concentrated in the efficient light emitting region, and a main current path is formed to generate the main light emission. On the contrary, in the first connection part 161 of the overcoat layer 160, light is hardly extracted to a non-efficient light emitting region Z. In the non-efficient light emitting region Z, even though power is consumed, light is hardly extracted, which deteriorates an external light extraction efficiency.

The organic light emitting device 100 according to one embodiment may include, on the color filter 150, a convex micro lens array (MLA) pattern in the overcoat layer 160. The light emitted from the organic light emitting layer 142 is locked in the first electrode 141 and the organic light emitting layer 142 due to total reflection. However, the light may advance at an angle smaller than a critical angle for total reflection by the inserted micro lens array structure, and the outward light emitting efficiency may be improved through multi-reflection.

In this case, the advancing angle of the light emitted from the organic light emitting layer 142 is changed by the inserted micro lens array pattern. The advancing angle of the light may be definitely changed even with a minute difference in micro lens array shape.

The shape of the convex parts 162 of the overcoat layer 160 is formed through a process, such as photolithography. When a heat treatment process to be performed in this case is adjusted, the morphology of the convex parts 162 of the overcoat layer 160 may be adjusted.

More detailed descriptions will be made below. In order to form the convex parts 162 of the overcoat layer 160, a photoresist is coated and patterned into a convex shape through a photolithography process, and then a heat treatment is performed. In this case, the shape of the convex parts 162 of the overcoat layer 160 may be formed when the heat treatment is not performed at once, but is performed stepwise in two steps. For example, prior to performing the final heat treatment at a temperature in the range of about 200° C. to about 250° C., an intermediate heat treatment should be performed first at a temperature in the range of about of about 100° C. to 130° C.

In this case, the time for performing the intermediate heat treatment is related to the morphology of the convex parts 162 of the overcoat layer 160. As the time for performing the intermediate heat treatment increases, the finally formed morphology of the convex parts 162 of the overcoat layer 160 increases. In an extreme case, when only the final heat treatment is performed since there is no time to perform the intermediate heat treatment, the morphology of the convex parts 162 of the overcoat layer 160 disappears, and the overcoat layer 160 is flattened.

Using this tendency, various organic light emitting devices were manufactured, which have different morphologies of the convex parts 162 of the overcoat layer 160, respectively. Using this, experiments were performed in order to determine how much morphology the convex parts 162 of the overcoat layer 160 have, i.e. how large of an aspect ratio the convex parts 162 of the overcoat layer 160 have when the organic light emitting diodes 140 may be operated to exhibit the maximum light emitting efficiency.

The organic light emitting device 100 according to one embodiment is to allow the light, which has been locked within the organic light emitting diodes 140 due to total reflection, to be extracted outward through a light path changed according to the shape of the convex parts 162 of the overcoat layer 160 inserted for improving the outward light extraction efficiency.

Because the change of the light path according to the shape of the convex parts 162 of the overcoat layer 160 inserted for improving the outward light extraction efficiency is a main factor for improving the light extraction efficiency, and the parameters determining the shape include the diameter (D), height (H), aspect ratio (A/R), FWHM (Full Width at High Maximum) (F), FWHM aspect ratio (F_A/R (=H/F)), and slope (S) of the convex parts 162 of the overcoat layer 160, the separated gap of the convex parts 162 on the bottom (G), the ratio of the FWHM aspect ratio in relation to the aspect ratio of the convex part 162 (Rm (Ratio of MLA=(F_A/R)/(A/R), and so on.

Figure 3A:
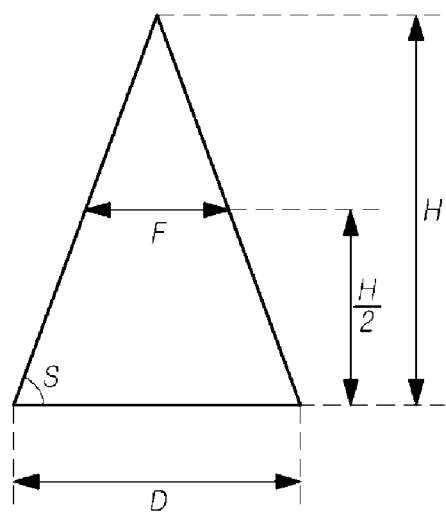
FIG. 3A conceptually represents parameters that determine a shape of convex parts of the overcoat layer.
Figure 3B:
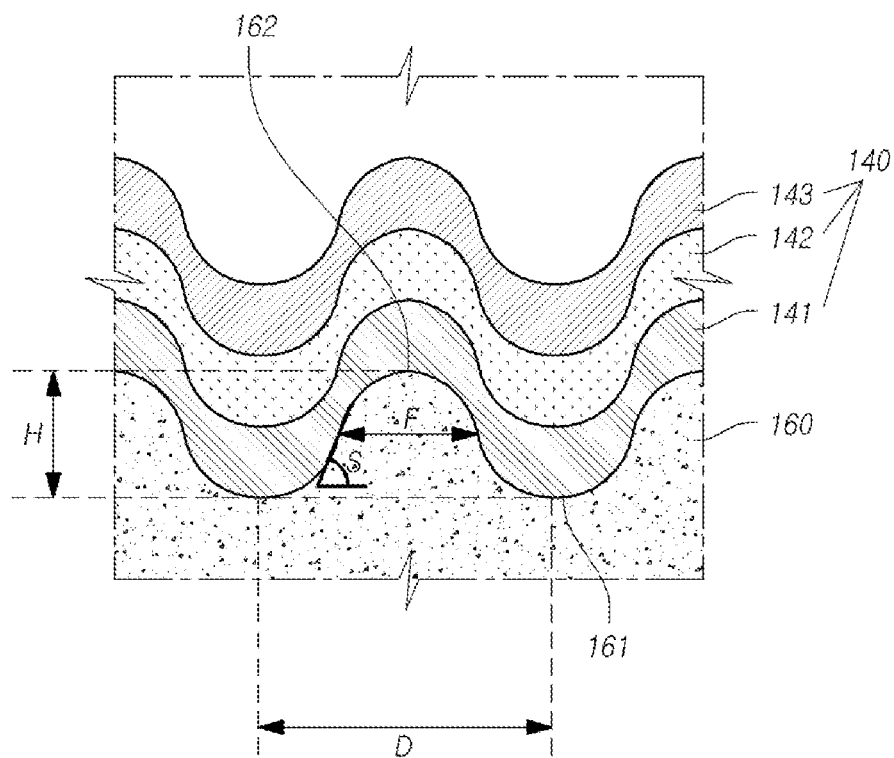
FIG. 3B represents parameters that determine a shape of convex parts of the overcoat layer in the organic light emitting device according to one embodiment.
Figure 3C:
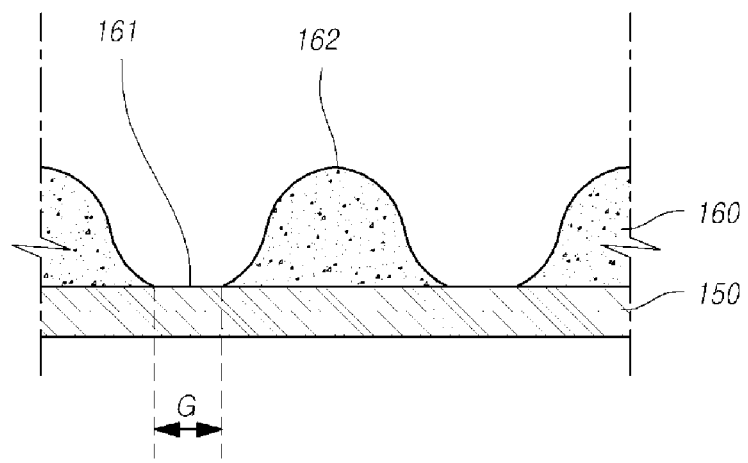
FIG. 3C is a view for describing the concept of a gap G in the bottom of a convex part of the overcoat layer.

FIG. 3A conceptually represents parameters that determine the shape of the convex parts 162 of the overcoat layer 160. FIG. 3B represents parameters that determine the shape of the convex parts of the overcoat layer in the organic light emitting device according to one embodiment. FIG. 3C is a view for describing the concept of a gap G in the bottom of a convex part of the overcoat layer.

Referring to FIGS. 3A and 3B, the diameter (D) of the convex part 162 of the overcoat layer 160 means a length of the convex part 162 between the centers of two adjacent connection parts 161, and the height (H) of the convex part 162 means a vertical distance from the bottom of the adjacent first connection parts 161 or from the bottom of the convex part 162 to the top of the convex part 162. As illustrated in FIG. 3A, the FWHM (F) means a width of the convex part 162 at the half height position of the convex part 162, i.e., a length between two adjacent connection parts 161 at the half position of the height of the convex part 162. The aspect ratio (A/R) of the convex parts 162 means a value obtained by dividing the height (H) of the convex parts 162 by the radius (D/2) of the convex parts 162, i.e., H/(D/2)= 2H/D.

The convex parts 162 may have a hexagonal shape having a diameter (D) in the range of 1 to 5 μm, and a height (H) in the range of 1 to 4 μm.

It has been found that the enhancement of current efficiency obtained when the aspect ratio (A/R) of the convex parts 162 of the overcoat layer 160 has a ratio in the range of about 0.2 to 0.8 is more excellent than that obtained when the aspect ratio (A/R) of the convex parts 162 of the overcoat layer 160 has a value exceeding 0.8. Rather, it has been found that when the enhancement of current efficiency of the convex parts 162 of the overcoat layer 160 has a value exceeding about 0.8, the enhancement of current efficiency rather tends to decrease. In particular, when the aspect ratio of the convex parts 162 of the overcoat layer 160 has a value in the range of about 0.4 to 0.7, it has been found that the enhancement of current efficiency is the maximum.

Thus, the surface in which organic light emitting diodes 140 are disposed in the illustrated organic light emitting device 100 according to one embodiment may be the top surface of the overcoat layer 160 in which the aspect ratio (A/R) of the convex parts 162 of the overcoat layer 160 has a value in the range of about 0.2 to 0.8. Alternatively, the surface in which organic light emitting diodes 140 are disposed in the illustrated organic light emitting device 100 according to one embodiment may be the top surface of a second passivation layer (not illustrated) that follows the morphology of the overcoat layer 160 as it is in which the aspect ratio (A/R) of the convex parts 162 of the overcoat layer 160 has a value in the range of about 0.2 to 0.8.

That is, in this case, the overcoat layer 160 or the second passivation layer (not illustrated) has a gentle and non-flattened surface, which has an aspect ratio (A/R) in the range of about 0.2 to 0.8, and hence, the organic light emitting diodes 140 are formed on the gentle and non-flattened surface, which has an aspect ratio (A/R) in the range of about 0.2 to 0.8. The anode 141, the organic light emitting layer 142, and the cathode 143 will have a shape that follows the morphology of the gentle and non-flattened surface.

In summary, in forming the convex parts 162 of the overcoat layer 160, it is possible to form the first connection parts 161 connecting the convex parts 162 of the overcoat layer 160 by performing the intermediate heat treatment process in forming the convex parts 162 of the overcoat layer 160, and somewhat shortening the intermediate heat treatment process. When the overcoat layer 160 is formed such that the aspect ratio (A/R) of the convex parts 162 of the overcoat layer 160 has a value in the range of about 0.2 to 0.8 according to the method described above, it is possible to form the organic light emitting diodes 140 each having an anode 141, an organic light emitting layer 142, and a cathode 143, and the bank 136 on the overcoat layer 160.

When only the aspect ratio (A/R) is applied as a parameter for defining the shape of the convex parts 162 of the overcoat layer 160, the shapes of the convex parts 162 of the overcoat layer 160 may be definitely changed when the values defined by the remaining parameters, such as the FWHM (F) and the gap (G) between the convex parts 162, are changed even though a ratio defined by the diameter (D) and the height (H) because the aspect ratio (A/R) is the same.

FIGS. 4A to 4D are cross-sectional views illustrating shapes of convex parts of the overcoat layer in comparison with the same aspect ratio.

Figure 4A:
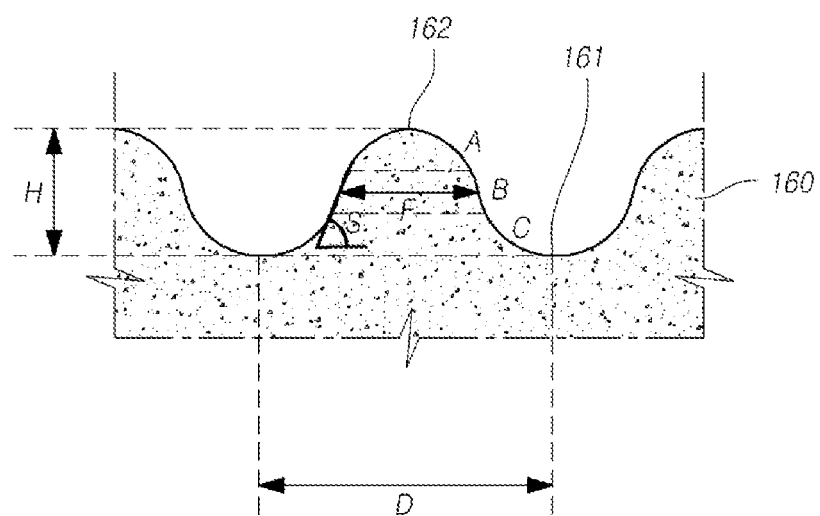
FIGS. 4A, 4B, 4C, and 4D are cross-sectional views illustrating shapes of convex parts of the overcoat layer in comparison with the same aspect ratio.

FIG. 4A illustrates the positions of first to third regions C, B, and A included in equal parts, respectively, when each convex part 162 of the overcoat layer 160 is divided into three equal parts with reference to the height thereof.

Figure 4B:
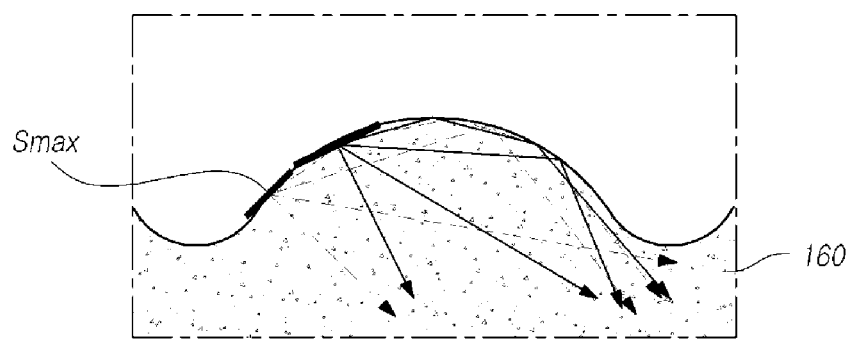
Figure 4C:
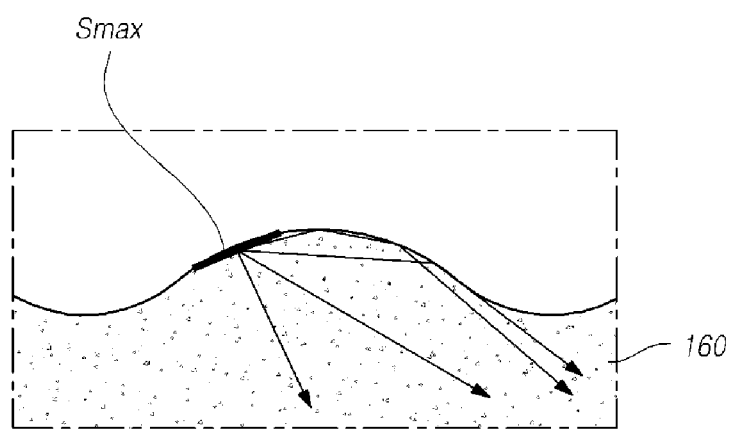
Figure 4D:
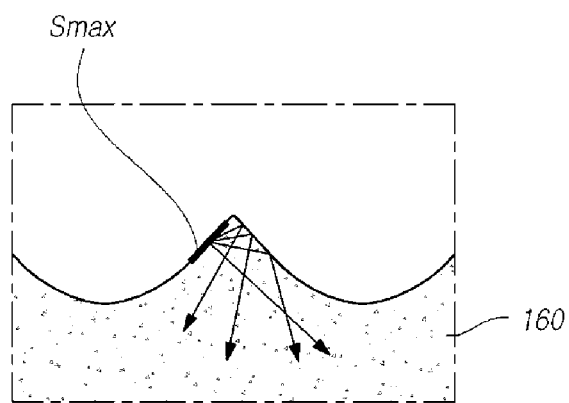

FIGS. 4B to 4D are cross-sectional views of the convex parts 162 of the overcoat layer 160, which have the same or similar aspect ratios (A/R) due to the same or similar diameters (D) or heights (H) of the convex parts 162 of the overcoat layer 160. The aspect ratio (A/R) of the convex parts 162 of the overcoat layer 160 illustrated in FIGS. 4B to 4D is about 0.6 which is included in the range of about 0.2 to 0.8 of the aspect ratio (A/R) of the convex parts 162 of the overcoat layer 160, which are excellent in enhancement of current efficiency as described above.

FIG. 4B illustrates a convex part 162 of the overcoat layer 160, which has the maximum slope (Smax) in the first region C when the convex part 162 of the overcoat layer 160 is divided into three equal parts with reference to the height H thereof. In this case, the slope (S) of the convex part 162 means an angle between a horizontal plane of the bottom surface of the convex part 162 and a tangent line abutting the convex part where the slope (S) is measured, as illustrated in FIGS. 3A and 3B. In this case, the maximum slope (Smax) means the slope in which the angle between the horizontal plane of the bottom surface of the convex part 162 and the tangent line abutting the convex part where the slope (S) is measured is the maximum.

FIG. 4C illustrates a convex part 162 of the overcoat layer 160, which has the maximum slope (Smax) in the second region B when the convex part 162 of the overcoat layer 160 is divided into three equal parts with reference to the height H thereof.

FIG. 4D illustrates a convex part 162 of the overcoat layer 160, which has the maximum slope (Smax) positioned in the third region A when the convex part 161 of the overcoat layer 160 is divided into three equal parts with reference to the height H thereof.

Even though the convex parts 162 of the overcoat layer 160 illustrated in FIGS. 4B to 4D have the same as or similar aspect ratios (A/R), the paths of the light emitted from the organic light emitting layers 142 may be different from each other according to the difference of the shapes of the convex parts 162 of the overcoat layer 160, and as a result there may exist a shape of the convex parts 162, which do not improve the light extraction efficiency at all.

Figure 5:
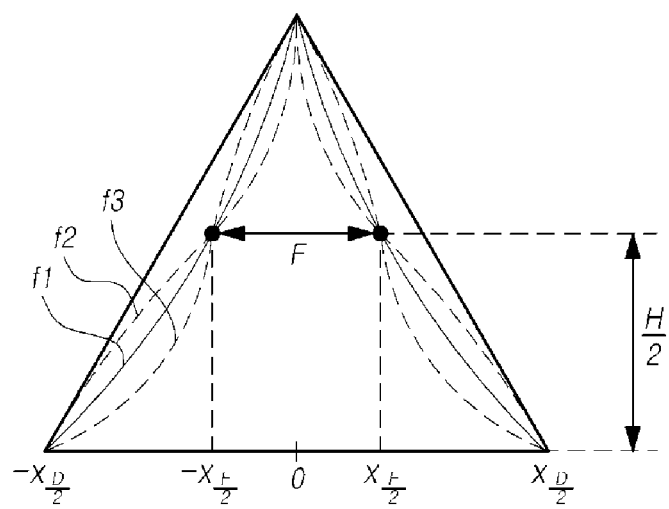
FIG. 5 illustrates various shapes of convex parts of the overcoat layer with the same or similar aspect ratios (A/R)

FIG. 5 illustrates various shapes of convex parts of the overcoat layer with the same or similar aspect ratios (A/R).

Referring to FIGS. 3A and 5, when the convex parts 162 of the overcoat layer 160 has a triangular shape as illustrated in FIG. 3A, the FWHM (F) of the convex parts 162 of the overcoat layer 160 is half the diameter (D/2). In this case, all of the slopes (S) of the lower surfaces of the convex parts 162 of the overcoat layer 160 are equal to each other.

Referring to FIG. 5, a convex part 162 of the overcoat layer 160 included in the organic light emitting device 100 according to one embodiment may have an FWHM (F) that is smaller than a radius (D/2). When the FWHM (F) of a convex part 162 of the overcoat layer 160 is larger than the radius (D/2) thereof, the side surfaces of the convex part 162 form a fat shape, which may increase light paths directed to the side surfaces, and as a result, may deteriorate the outward light extraction efficiency.

On the contrary, when the FWHM (F) of a convex part 162 of the overcoat layer 160 is smaller than the radius (D/2)

thereof, the side surfaces of the convex part 162 form a sunken shape, which may decrease light paths directed to the side surfaces, and as a result, may improve the outward light extraction efficiency. In this case, the convex part 162 of the overcoat layer 160 included in the organic light emitting device 100 according to one embodiment may have a small ratio of the FWHM (F) in relation to the radius (D/2) thereof, which is 0.1 or less.

Figure 6:
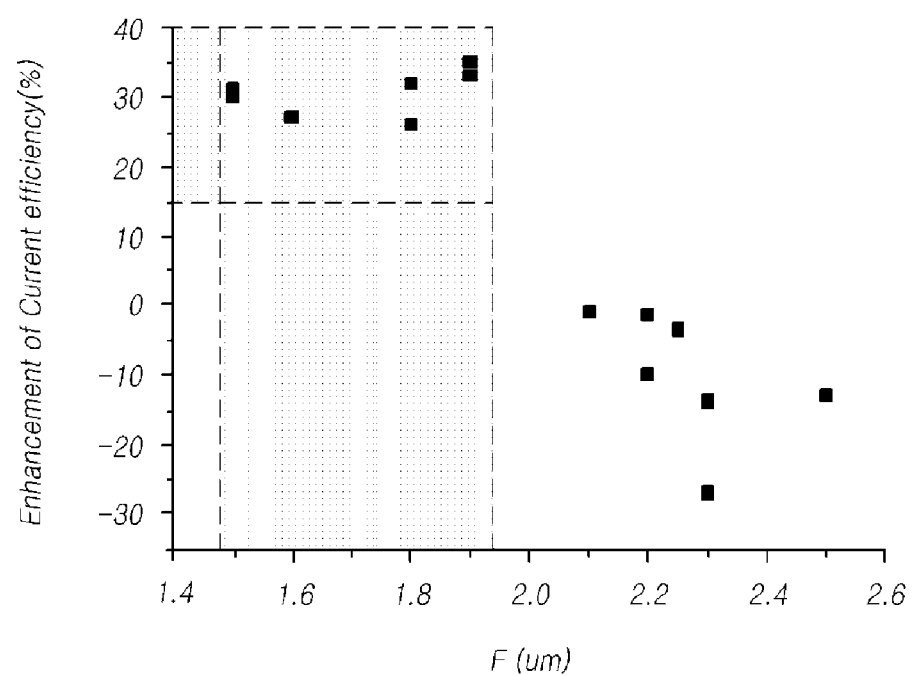
FIG. 6 is a graph illustrating a relationship between FWHM F and current efficiency enhancement (%) or enhancement of current efficiency (%) of each of organic light emitting devices in which the FWHMs F of the convex parts of the overcoat layer have various values, respectively.

FIG. 6 is a graph illustrating a relationship between FWHM F and current efficiency enhancement (%) or enhancement of current efficiency (%) of each of organic light emitting devices in which the FWHMs F of the convex parts 162 of the overcoat layer 160 have various values, respectively. Here, current efficiency enhancement (%) is relative to the current efficiency measured with an organic light emitting device formed on a flat overcoat layer 160, without the MLA structure according to the embodiments herein. In this case, when the enhancement of current efficiency is high, it means that the light emitting efficiency is excellent.

For example, it has been found that, in the organic light emitting device 100, which has an aspect ratio (A/R) of 0.76 because the diameter (D) of the convex parts 162 of the overcoat layer 160 is 4.5 μm and the height (H) is 1.7 μm, the enhancement of current efficiency obtained when the FWHM (F) is less than 2.0 μm is more excellent than that obtained when the FWHM (F) is 2.0 or more. Rather, it has been found that, when the enhancement of current efficiency obtained when the FWHM (F) of the convex parts 162 of the overcoat layer 160 has a value of 2.0 μm or more, the enhancement of current efficiency rather tends to decrease (the enhancement of current efficiency has a negative value).

In summary, even if the convex parts 162 of the overcoat layer 160 are configured to have an aspect ratio (A/R) of an optimum value, when the FWHM (F) has a value of 2.0 μm or more, the angle of the light advancing within the organic light emitting diode 140 becomes a critical angle of total reflection (for example, 42 degrees) or more at the interfaces between the various layers of the organic light emitting device, which causes the light to be unavoidably locked between the substrate 110 and the organic light emitting layer 142. Due to this, it has been found that the enhancement of current efficiency rather tends to decrease, thereby deteriorating the light emitting efficiency.

Meanwhile, the FWHM aspect ratio (F_A/R) of the convex parts 162 may be larger than the aspect ratio (A/R). In this case, the FWHM aspect ratio (F_A/R) of the convex parts 162 means a ratio of the height H in relation to the FWHM (F). The ratio of the FWHM aspect ratio in relation to the aspect ratio may be larger than 1.0. As described above, when the aspect ratio (A/R) of the convex parts 162 is in the range of 0.7 to 0.8, for example, the FWHM aspect ratio (F_A/R) of the convex parts 162 may be larger than 0.8 and smaller than 2.0.

As illustrated in FIG. 5, even when the FWHMs (F) of the convex parts 162 of the overcoat layer 160 are smaller than the radius (D/2) and are equal to each other, the convex parts 162 may have various shapes.

For example, when the FWHM (F) of a convex part 162 of the overcoat layer 160 is smaller than the radius D/2, the convex part 162 may have a shape in which, with reference to the left upper surface, the slope (S) of the convex 162 of the overcoat layer 160 continuously increases from the bottom to the top (the shape of f1 in FIG. 5). Further, in the same case, the convex part 162 of the overcoat layer 160 may have a shape in which the slope S gradually decreases from the maximum slope (Smax) to the minimum slope (Smin) and then gradually increases again from the minimum slope (Smin) (the shape of f2 in FIG. 5). Further, in the same case, the convex part 162 of the overcoat layer 160 may have a shape in which the slope S gradually increases to reach the maximum slope (Smax) and then gradually decreases (the shape of f3 in FIG. 5).

As described above with reference to FIG. 2A, due to the characteristic of the deposition process of the organic light emitting layer 142, the light emission quantity of the organic light emitting layer 142 is the largest at a position where the slope of the organic light emitting layer 142 is the largest between the convex part 162 and the first connection part 161 of the overcoat layer 160. Accordingly, when a convex part 162 has the shape of f1 or the shape of f2, the position where the light emission quantity is the largest is positioned on the bottom or the top of the convex part 162. In this case, the light emitted from the organic light emitting layer 142, which has been locked inside the first electrode 141 and the organic light emitting layer 142 by being totally reflected at the interfaces between the organic light emitting layer 142, the first electrode 141, and the overcoat layer 160, advances at an angle smaller than a critical angle for total reflection by the inserted micro lens array structure, and the effects of improving the outward light emitting efficiency through multi-reflection is inevitably reduced.

In other words, in the case where the convex parts 162 of the overcoat layer 160 have a shape in which the slope increases from the bottom and then decreases from the maximum slope (f3 in FIG. 5), the organic light emitting device 100 according to one embodiment may have the maximum outward light extraction efficiency as the light emitted from the organic light emitting layer 142 advance at an angle smaller than the critical angle for total reflection and the outward light emission efficiency increases through multi-reflection.

Meanwhile, the outward light extraction efficiency may be improved when the first connection part that connects each of the convex parts of the overcoat layer 160 has a gentle slope. As illustrated in FIG. 3C, the gap (G) of the convex parts 162 in the bottom is zero (0) when the outward light emission efficiency is the maximum. This is because, when G is larger than 0, the effective light emitting region is reduced due to the existence of a gap between each two adjacent convex parts 162, and thus, the light emitting efficiency may be reduced by the region of the gap G.

Figure 7A:
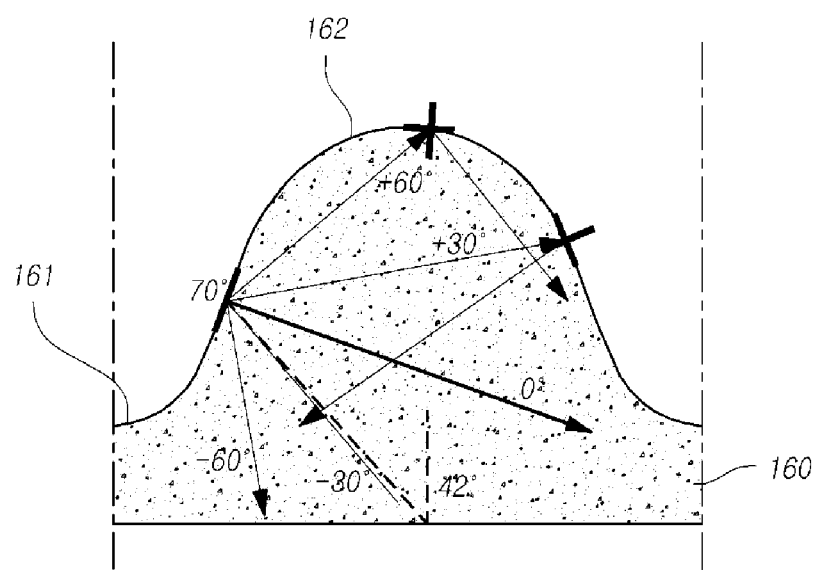
FIGS. 7A and 7B are views illustrating light paths according to the maximum slope of the convex parts of the overcoat layer.
Figure 7B:
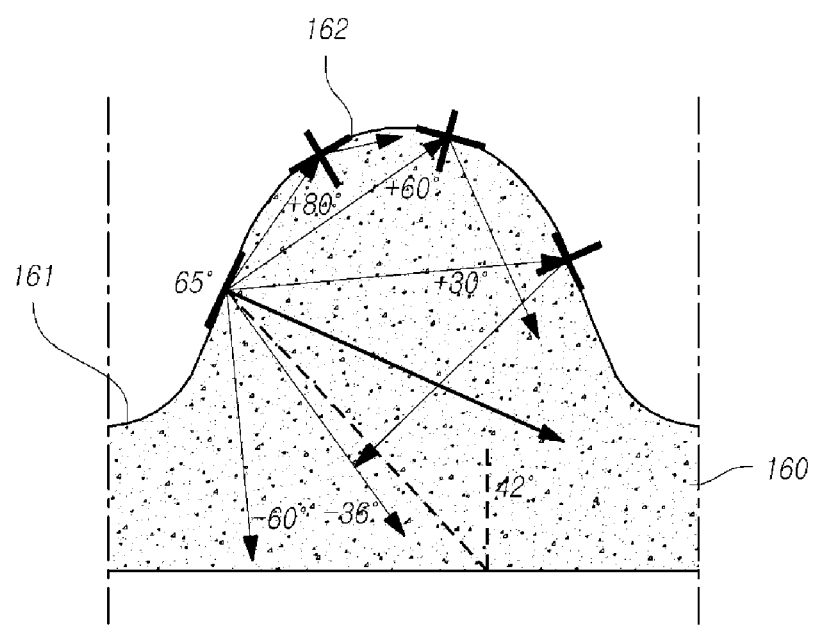

FIGS. 7A and 7B are views illustrating light paths according to the maximum slope of the convex parts of the overcoat layer.

Referring to FIGS. 7A and 7B, the convex parts 162 of the overcoat layer 160 may have a shape in which, as illustrated in FIG. 5, the slope increases from the bottom and then decreases from the maximum slope (Smax) (the shape of f3 in FIG. 5).

As illustrated in FIGS. 7A and 7B, even if the convex parts 162 of the overcoat layer 160 have a shape in which the slope increases and then decreases from the maximum slant (Smax) (the shape of f3 in FIG. 5), the convex parts 162 may have various shapes depending on the angle of the maximum slant.

As illustrated in FIGS. 7A and 7B, when the maximum slope (Smax) in the shape of the convex parts 162 of the overcoat layer 160 may have a large angle exceeding 60 degrees (e.g., 70 degrees (FIG. 7A) or 65 degrees (FIG. 7B)), the advancing angle of the light relative to a plane orthogonal to an external interface of the organic light emitting device where the light is emitted from the organic light emitting device, which starts to advance from an effective light emitting region, may be 42 degrees or more, and consequently, the light is locked inside the organic light emitting diodes 140 again so that the light emitting efficiency may not be improved.

Accordingly, the shape of the convex parts 162 of the overcoat layer 160 illustrated in FIGS. 4B to 4D may improve the light emitting efficiency in the case where the maximum slant (Smax) of the convex parts 162 may be in the range of 40 degrees to 60 degrees (e.g., 50 degrees) because, in view of the advancing angle of the light, which starts to advance from an effective light emitting region, the light emitted from the organic light emitting layer 142 is not locked within the organic light emitting diode 140.

Figure 8:
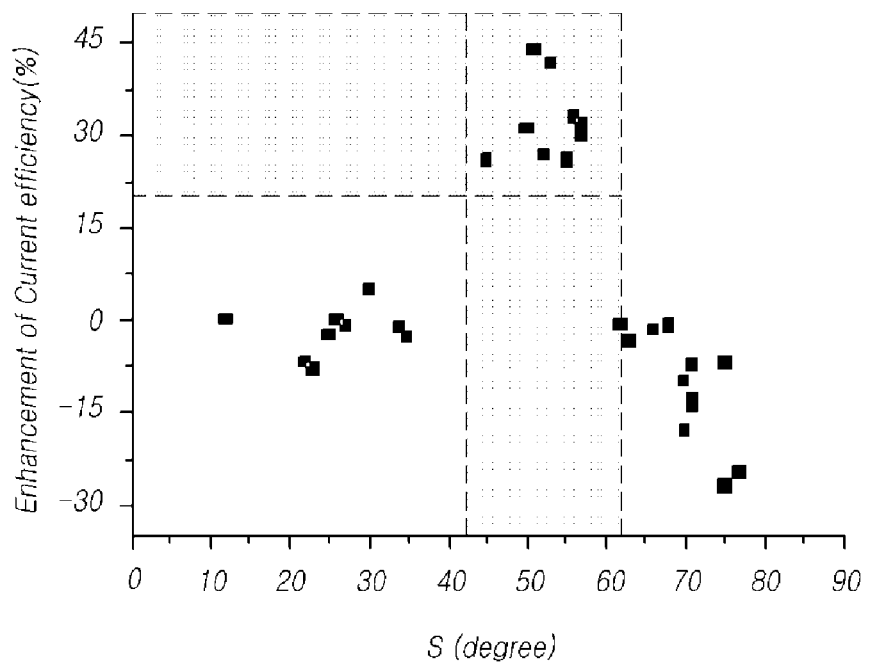
FIG. 8 is a graph illustrating a relationship between maximum slope (Smax) and current efficiency enhancement (%) or enhancement of current efficiency (%) of each of organic light emitting devices in which the maximum slopes (Smax) of the convex parts 162 of the overcoat layer 160 have various values, respectively.

FIG. 8 is a graph illustrating a relationship between a maximum slope (Smax) and current efficiency enhancement (%) or enhancement of current efficiency (%) of each of organic light emitting devices in which the maximum slopes (Smax) of the convex parts 162 of the overcoat layer 160 have various values, respectively.

Referring to FIG. 8, it has been found that, when the maximum slope Smax of the convex parts 162 of the overcoat layer 160 is less than 40 degrees, the efficiency is little improved because the light advancing angle in an effective light emitting region is not substantially different from that in a flat organic light emitting diode of the overcoat layer 160. In addition, when the maximum slant Smax of the convex parts 162 of the overcoat layer 160 exceeds 60 degrees, because the light advancing angle is formed to be larger than the total reflection angle of the substrate 110 and the air layer outside the substrate 110, the quantity of light locked inside the organic light emitting diode 140 greatly increases so that the efficiency is rather deteriorated as compared to that of a flat organic light emitting diode of the overcoat layer 160.

As described above, the shape of the convex parts 162 of the overcoat layer 160 illustrated in FIGS. 4B to 4D may improve the light emitting efficiency in the case where the maximum slant (Smax) of the convex parts 162 is in the range of 40 degrees to 60 degrees because, in view of the advancing angle of the light, which starts to advance from an effective light emitting region, the light emitted from the organic light emitting layer 142 is not locked within the organic light emitting diode 140.

As described above, FIGS. 4B to 4D illustrate the convex parts 162 of the overcoat layer 160, which have the maximum slope (Smax) positioned in the first region C to the third region A when the convex parts 162 of the overcoat layer 160 are divided into three equal parts with reference to the height H thereof.

A ratio (Rm) of the FWHM aspect ratio in relation to the aspect ratio of the convex part 162 is a ratio of the FWHM aspect ratio (A/R) to the aspect ratio (A/R) of the convex part 162 (i.e., Rm=(F_A/R)/(A/R)=(H/F)/(2H/D)), and is a parameter that determines whether the region having the steepest and maximum slope (Smax) exists in the first region C to the third region A. When the ratio (Rm) of the FWHM aspect ratio in relation to the aspect ratio of the convex part 162 is less than 1.0, the region having the maximum slope (Smax) is the first region C. When the ratio (Rm) of the FWHM aspect ratio in relation to the aspect ratio of the convex part 162 is 1.0, the region having the maximum slope (Smax) is the second region B. When the ratio (Rm) of the FWHM aspect ratio in relation to the aspect ratio of the convex part 162 is larger than 1.0, the region having the maximum slope (Smax) is the third region A.

Referring to the light paths of the light emitted from the organic light emitting layers 142 illustrated in FIGS. 4B to 4D, it can be seen that the front light emitting efficiency is the highest when the maximum slope (Smax) of the convex part 162 is positioned in the third region A that is closest to the top among the first to third regions divided from the convex part 162 from the bottom with reference to the height H. As described above, when the organic light emitting diode 140 is driven, in an effective light emitting region Y, electric fields are locally concentrated and a main current path is formed such that main light emission is generated. On the contrary, in the first connection parts 161 of the overcoat layer 160, light is hardly extracted to a non-efficient light emitting region Z. When the maximum slant may be located at or more biased to the first region C and the second region B, the light emitting efficiency may be deteriorated.

In the foregoing, descriptions have been made concerning the light extraction efficiency or light emitting efficiency according to the shape of the convex parts 162 when the overcoat layer 160 includes the convex parts 162. Hereinafter, it will be described that even when the overcoat layer 160 includes concave parts, the concave parts also have an outward light extraction efficiency or light emitting efficiency according to the shape thereof like the convex parts 162, with reference to FIG. 9A.

Figure 9A:
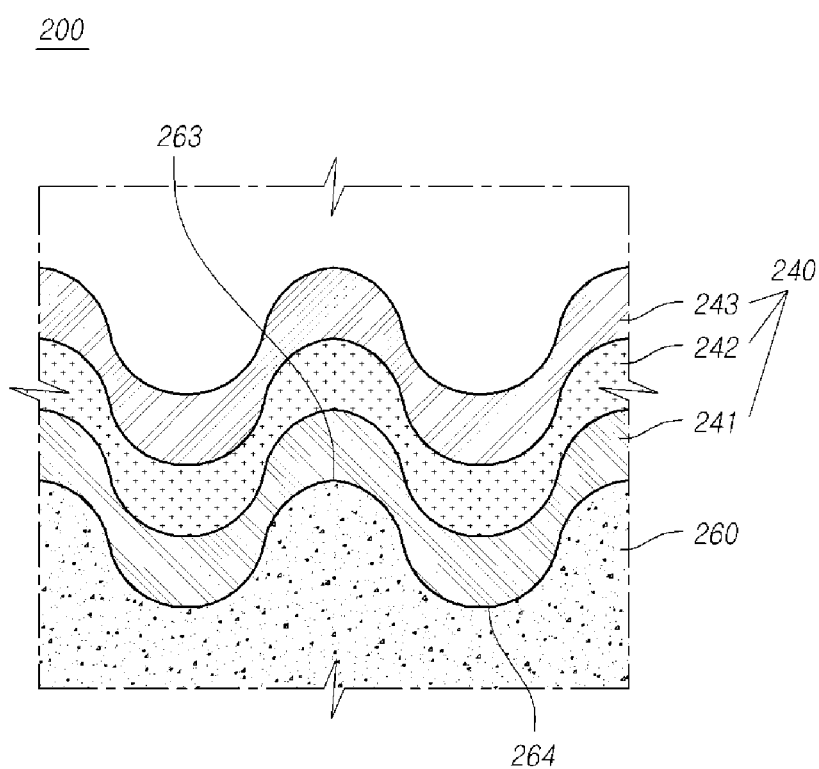
FIG. 9A is a cross-sectional view for describing an organic light emitting device including an overcoat layer including a plurality of concave parts according to another embodiment.

FIG. 9A is a cross-sectional view for describing an organic light emitting device including an overcoat layer including a plurality of concave parts according to another embodiment.

Referring to FIG. 9A, an organic light emitting device 200 according to another embodiment is substantially the same as the organic light emitting device 100 of FIG. 1 and FIGS. 2A and 2B, except that an overcoat layer 260 includes a plurality of concave parts 264, and thus duplicate descriptions are omitted. The elements of the organic light emitting device 200, which are not illustrated in FIG. 9A, may be similar to the elements of the organic light emitting device 100 according to one embodiment, which has been described above with reference to FIG. 1 and FIGS. 2A and 2B.

The overcoat layer 260 includes a plurality of concave parts 264 formed to be superimposed on the color filter (not shown in Figure) and a plurality of second connection parts 263, each of which interconnects adjacent concave parts 264. In other words, the overcoat layer 260 includes a plurality of concave parts 264 disposed to be superimposed on the opening 136a of the bank 136 illustrated in FIG. 1 and a plurality of second connection parts 263, each of which interconnects adjacent concave parts 264.

A first electrode 241 is disposed on the overcoat layer 260. The first electrode 241, and an organic light emitting layer 242 and a second electrode 243 are disposed on the overcoat layer 260. The first electrode 241, the organic light emitting layer 242, and the second electrode 243 constitutes an organic light emitting diode 240.

The first electrode 241, the organic light emitting layer 242, and the second electrode 243 may be disposed according to the shape of the top surface of the overcoat layer 260 to have a shape that follows the morphology of the overcoat layer 260.

The FWHM (F) of the concave parts 264 of the overcoat layer 260 may be smaller than the radius (D/2) of the concave parts 264, similar to the feature that the FWHM (F) of the convex parts 162 of the overcoat layer 160 is smaller than the radius (D/2) of the convex parts 162 as described above with reference to FIGS. 3A and 3B. In this case, the ratio of the FWHM (F) in relation to the radius (D/2) of the concave parts 264 may be 0.1 or less.

The FWHM aspect ratio (F_A/R) of the concave parts 264 of the overcoat layer 260 may be larger than the aspect ratio (A/R) of the concave parts 264, similar to the feature that the FWHM aspect ratio (F_A/R) of the convex parts 162 of the overcoat layer 160 is larger than the aspect ratio (A/R) of the convex parts 162 as described above with reference to FIGS. 3A and 3B. In this case, the ratio of the FWHM aspect ratio (F_A/R) in relation to the aspect ratio (A/R) of the concave parts 264 may be larger than 1.0.

In this case, the concave parts 264 may have a hexagonal shape having a diameter in the range of 1 to 5 µm, and a height in the range of 1 to 4 µm.

Similar to the feature that the convex parts 162 of the overcoat layer 160 have a shape in which the slant increases and then gradually decreases from the maximum slant as described above with reference to FIGS. 4B to 5, the slant of the concave parts 264 of the overcoat layer 260 have a shape in which the slant from the bottom and then gradually decreases from the maximum slant.

Similar to the feature that the maximum slope of the convex parts 162 of the overcoat layer 160 is in the range of 40 degrees to 60 degrees as described above with reference to FIGS. 7A to 8, the maximum slant of the concave parts 264 of the overcoat layer 260 may be in the range of 40 to 60 degrees.

In the forgoing, it has been described that when the overcoat layer 260 includes the concave parts 264, the concave parts 264 have an outward light extraction efficiency or light emitting efficiency, similar to the convex parts 162 of the overcoat layer 160 of the organic light emitting device 100 described above with reference to FIG. 1. However, characteristics according to the shapes of the concave parts 264 and the second connection parts 263 according to omitted parameters are the same as those described above with reference to the convex parts 162 and the first connection parts 161.

In the forgoing, it has been described that when the overcoat layer includes the concave parts, the concave part has an outward light extraction efficiency or light emitting efficiency according to the shape thereof. Hereinafter, even when the first electrode includes a plurality of concave parts or a plurality of convex parts, an outward light extraction efficiency or light emitting efficiency is the same as when the overcoat layer includes a plurality of convex parts or concave parts in reference with FIG. 9B.

Figure 9B:
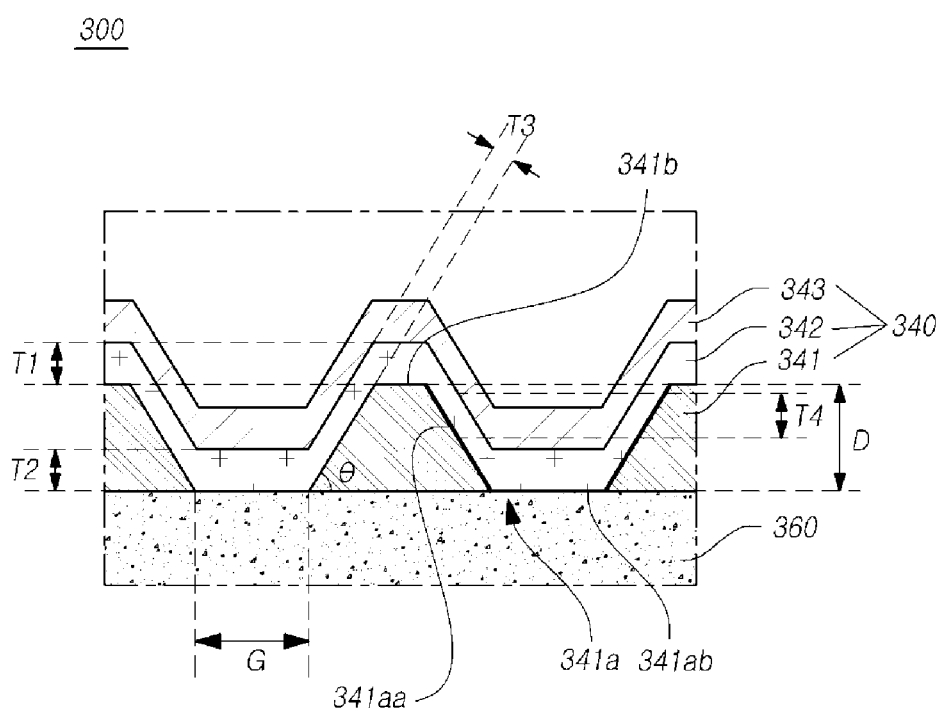
FIG. 9B is a cross-sectional view for describing an organic light emitting device including a first electrode including a plurality of convex parts or a plurality of concave parts according to further another embodiment.

FIG. 9B is a cross-sectional view for describing an organic light emitting device including a first electrode including a plurality of convex parts or a plurality of concave parts according to further another embodiment.

Referring to FIG. 9B, an organic light emitting device 300 according to further another embodiment is substantially the same as the organic light emitting device 100 of FIGS. 1 to 2B and FIG. 9A, except that a first electrode 341 includes a plurality of concave parts 341a instead of the overcoat layer including a plurality of convex parts 162 or concave parts 264, and thus duplicate descriptions are omitted. The elements of the organic light emitting device 300, which are not illustrated in FIG. 9B, may be similar to the elements of the organic light emitting device 100 and 200 according to one embodiment, which has been described above with reference to FIGS. 1 to 2B and FIG. 9B.

The organic light emitting device 300 may include an organic light emitting diode 340 on the substrate 310. The organic light emitting diode 340 may include a first electrode 341, an organic light emitting layer 342 and a second electrode 343 on the overcoat layer 360.

The first electrode 341 includes concave parts 341a and a third connection part 341b connecting neighboring concave parts 341a. The first electrode 341 functions as a flattening layer in a part where no concave part 341a is disposed, that is, in the third connecting part 341b.

When a plurality of concave parts 241a are provided, the concave parts 341a have a shape inclined to be narrowed downward. For example, the cross-sectional shape of the concave parts 341a may be a trapezoidal shape, but is not limited thereto.

The inclination θ of the inclined surface of the concave part 341a means an angle formed by the inclined surface of the concave part 341a and the bottom surface of the first electrode 341, and the inclination θ may be an acute angle.

FIG. 9B illustrates that the inclined surface 341aa of the concave part 341a is linear in a cross section. The inclined surface 341aa of the concave part 341a is three-dimensionally flat. However, the inclined surface 341aa of the concave part 341a may be generally linear or planar, although it may include a non-linear or three-dimensionally curved surface in a cross section.

The inclination θ of the inclined surface 341aa of the concave part 341a may be 15 to 70 degrees. The inclination θ of the inclined surface of the convex part may be 15 to 70 degrees.

When the inclination θ of the inclined surface 341aa of the concave part 341a has a small angle of less than 15 degrees, the light extraction efficiency may be weak. When the inclination θ of the inclined surface 341aa has an angle greater than more than 70 degrees, the traveling angle of light, which starts to travel from an effective light emitting region, may be 42 degrees or more. Consequently, the light may be confined again inside the organic light emitting diode 340 and the light emitting efficiency may not be increased.

The concave parts 341a or the convex parts may have a circular shape as a whole in a plan view. However, without being limited thereto, the concave parts 341a or the convex parts may have various shapes, such as a hemispherical shape, a semi-ellipsoidal shape, a square shape, and a hexagonal shape.

The shape of the concave parts 341a of the first electrode 341 is formed through the processes, such as photolithography, wet etching, and dry etching. In this case, the morphology of the concave parts 341a of the first electrode 341 can be adjusted when a heat treatment process performed at this time is adjusted. The shape of the convex parts of the first electrode 341 may be formed through the same processes.

In terms of material, the first electrode 341 may include an amorphous metal oxide. For example, the amorphous metal oxide may include any one selected from a group consisting of Indium Zinc Oxide (IZO), Zinc Tin Oxide (ZTO), $SnO_2$ (tin oxide), ZnO (zinc oxide), $In_2O_3$ (indium oxide), Gallium Indium Tin Oxide (GITO), Indium Gallium Zinc Oxide (IGZO), Zinc Indium Tin Oxide (ZITO), Indium Gallium Oxide (IGO), $Ga_2O_3$ (gallium oxide), Aluminum Zinc Oxide (AZO) and Gallium Zinc Oxide (GZO).

The organic light emitting layer 342 is disposed on the first electrode 341, and the second electrode 343 is disposed on the organic light emitting layer 342 to supply electrons or holes to the organic light emitting layer 142. The organic light emitting layer 342 and the second electrode 343 are disposed in a shape that follows the morphology of the top surface of the first electrode 341. Accordingly, the organic light emitting layer 342 and the second electrode 343 have a concave morphology in the concave parts 341a of the first electrode 341. Consequently, the shape of the organic light emitting diode 340 may be implemented using the concave parts 341a of the first electrode 341. Similarly, the shape of the organic light emitting diode 340 may be implemented using the convex parts of the first electrode 141.

The thickness of the organic light emitting layer 342, which is perpendicular to the first electrode 341, may be relatively thin in a region corresponding to the inclined surface 341aa of each concave part 341a, and may be thinner than the thickness of the organic light emitting layer 342 in the bottom 341ab of the concave part 341a or the third connection part 341b of the first electrode 341.

For example, when the organic light emitting layer 342 is formed through a vapor deposition process, the thicknesses T1, T2, and T4 of the organic light emitting layer 342 deposited in a direction perpendicular to the substrate 310 are the same as each other.

However, due to the characteristics of the vapor deposition process, the thickness T3 of the organic light emitting layer 342 driving a current between the practical first and second electrodes 341 and 343 in the vertical direction on the inclined surface of the organic light emitting layer 342 becomes relatively thin. The thicknesses T1 and T2 of the organic light emitting layer 342 driving a current between the first electrode 341 and the second electrode 343 are relatively thick in the bottom 341ab of the concave part 341a and the third connection part 341b.

The thickness T3 of the organic light emitting layer 342, which is perpendicular to the first electrode 341 in the region corresponding to the inclined surface 341aa of each concave part 341a, is reduced as the inclination θ of the inclined surface 341aa of the concave part 341a is increased. The thickness T3 of the organic light emitting layer 342, which is perpendicular to the first electrode 341 in the region corresponding to the inclined surface 341aa of each concave part 341a, and the inclination θ of the inclined surface 341aa of the concave part 341a are determined according to Equation 1 as follows.

$$T3 = T1 * \cos\theta = T2 * \cos\theta = T4 * \cos\theta \quad \text{Equation 1}$$

In view of the light emission quantity of the organic light emitting layer 342 depending on the thicknesses (T1, T2, T3, etc.) of the organic light emitting layer 342, which is perpendicular to the first electrode 341, the light emission quantity per unit area of the organic light emitting layer 342 in the inclined surface 341aa between the bottom 341ab of the concave part 341a and the first connection part 341b of the first electrode 341 may be larger than the light emission quantity per unit area of the organic light emitting layer 342 in the bottom 341ab of the concave part 341a or the first connection part 341b.

In the forgoing, it has been described that when the first electrode 341 in the organic light emitting device 300 according to further another embodiment includes the concave parts or the convex parts, it may have the same outward light extraction efficiency or light emitting efficiency as the organic light emitting device 100 and 200 of FIGS. 1 to 2B and FIG. 9A. In detail, the characteristic of the first electrode 341 according to the shapes of the convex parts or the concave part 341a may be the same as that of the convex parts 162 of the overcoat layer 160 of the organic light emitting device 100 and the concave parts 264 of the coating layer 260 as described above.

Figure 10:
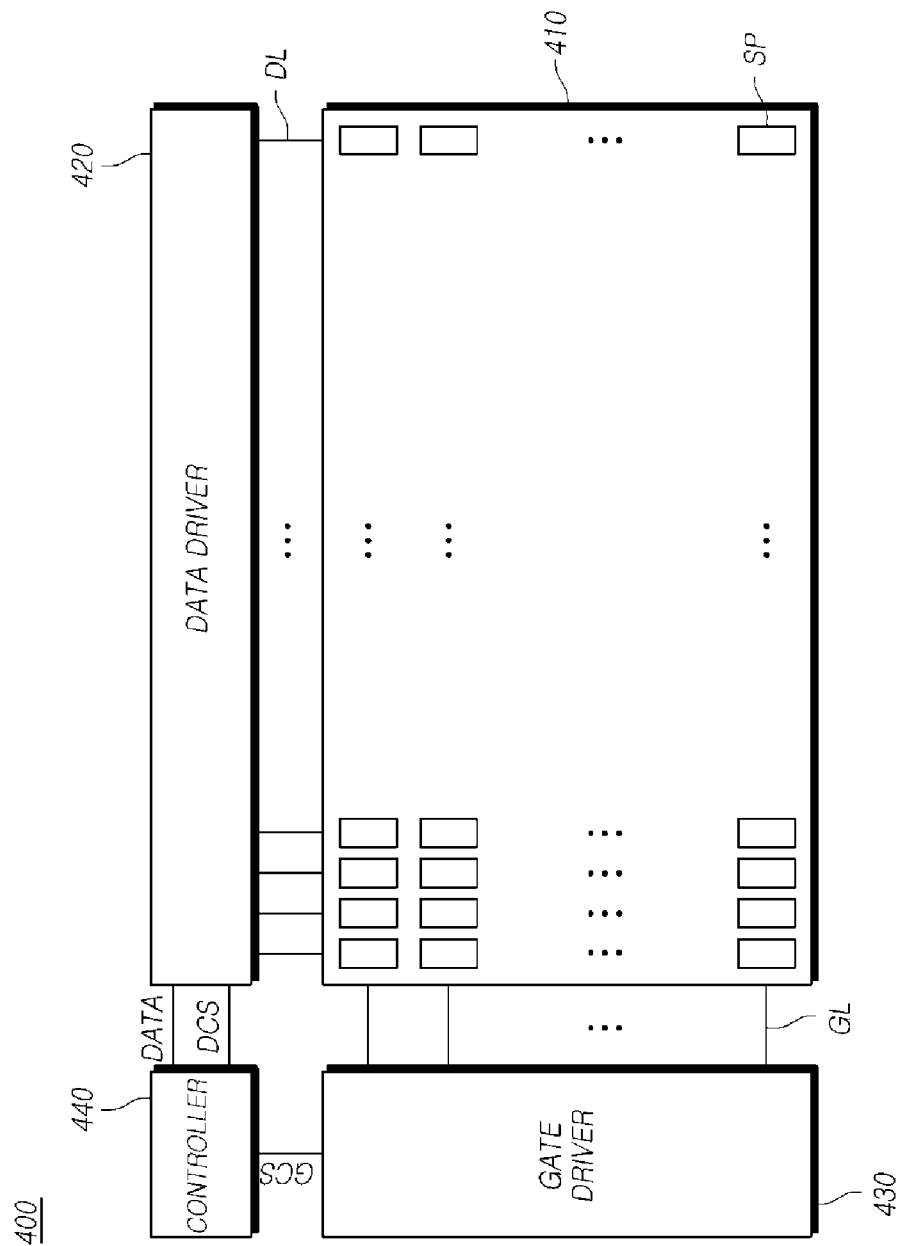
FIG. 10 is a view schematically illustrating a system configuration of an organic light emitting diode display device when the organic light emitting device according to the exemplary embodiment is the organic light emitting diode display device.

FIG. 10 is a view schematically illustrating a system configuration of an organic light emitting device when the organic light emitting device according to the exemplary embodiment is the organic light emitting diode display device.

Referring to FIG. 10, an organic light emitting diode display device 400 according to the embodiments includes an organic light emitting display panel 410 in which a plurality of data lines DL and a plurality of gate lines GL are disposed and a plurality of subpixels SP are disposed in a matrix type; a data driver 420 configured to drive the plurality of data lines by supplying a data voltage to the plurality of data lines; a gate driver 430 configured to sequentially drive the plurality of gate lines by sequentially supplying a scan signal to the plurality of gate lines; and a controller 440 configured to control the data driver 420 and the gate driver 430.

Each of a plurality of pixels disposed in an organic light emitting display panel 410 according to the embodiments includes an organic light emitting diode that are described above with reference to FIG. 1. Each of a plurality of pixels disposed in an organic light emitting display panel 410 according to the embodiments may further include a thin film transistor which drives the organic light emitting diode.

The organic light emitting diode includes an overcoat layer on a substrate, a first electrode disposed on the overcoat layer, an organic light emitting layer disposed on the first electrode and including a convex or concave curve; and a second electrode disposed on the organic light emitting layer as described above referring to FIGS. 2A to 9B.

The region having the thinnest thickness in the organic light emitting layer is located between the bottom and the top of the curve.

The overcoat layer may include one of a convex part and a concave part corresponding to the curve of the organic light emitting layer as described above referring to FIGS. 1 to 9A. The first electrode may also include a concave part or a convex part corresponding to the curve of the organic light emitting layer in the active area of the substrate as described above referring to FIG. 9B.

The surface of the first electrode contacted to the organic light emitting layer may have a shape that follows a morphology of the organic light emitting layer. The surfaces of the first electrode and the overcoat layer sequentially contacted to the organic light emitting layer may have shapes that follow a morphology of the organic light emitting layer. Contrary, the organic light emitting layer may have a convex or concave curve that follows a morphology of either the overcoat in FIGS. 1 to 9A or the first electrode in FIG. 9B.

Figure 11:
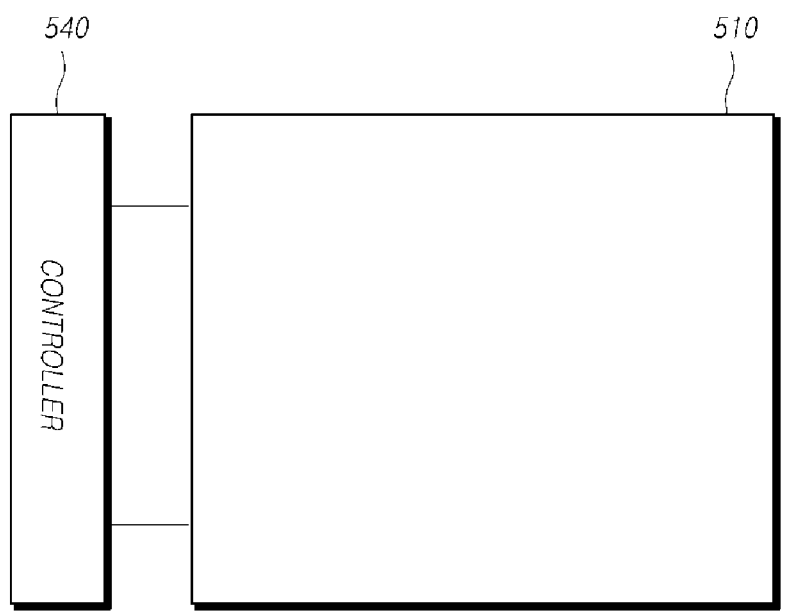
FIG. 11 is a view schematically illustrating a system configuration of a lighting device when the organic light emitting device according to the exemplary embodiment is the lighting device.

FIG. 11 is a view schematically illustrating a system configuration of a lighting device when the organic light emitting device according to the exemplary embodiment is the lighting device.

Referring to FIG. 11, when the organic light emitting device 500 according to the exemplary embodiment is the lighting device, the lighting device 500 may include a lighting unit 510 and a controller 540 for controlling the lighting unit 510 and the like. The lighting device 500 may include a driver such as the organic light emitting display 400, but is not limited thereto.

When the organic light emitting device 500 is the lighting device, it can be applied to the above-described lighting devices, such as the indoor/outdoor lighting device, the vehicle lighting device, or the like and applied to the above-described lighting devices in combination with other equipments.

Although the organic light emitting device 500 is the lighting device, it is not limited thereto. It may be a light source.

According to the above-described embodiments, an organic light emitting device is capable of improving the outward light emitting efficiency and reducing power consumption.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. An organic light emitting device comprising:
   an overcoat layer disposed on a substrate and including a plurality of convex parts or a plurality of concave parts, at least one of the convex parts of the overcoat layer having a Full Width at High Maximum ("FWHM") smaller than a radius of said at least one of the convex parts of the overcoat layer;
   a first electrode disposed on the overcoat layer in a direction away from the substrate;
   an organic light emitting layer disposed on the first electrode in the direction away farther from the substrate than the first electrode is from the substrate; and
   a second electrode disposed on the organic light emitting layer in the direction farther away from the substrate than the organic light emitting layer is from the substrate.

2. The organic light emitting device of claim 1, wherein the overcoat layer further includes a connection part that interconnects two adjacent ones of the convex portions or two adjacent ones of the concave portions, and the organic light emitting layer is thinnest between a center of each of the two adjacent convex parts or the two adjacent concave parts and the connection part.

3. The organic light emitting device of claim 1, wherein a ratio of the FWHM to the radius of said one of the convex parts or said one of the concave parts is 1.0 or less.

4. The organic light emitting device of claim 1, wherein an FWHM aspect ratio of said one of the convex parts is larger than an aspect ratio of said one of the convex parts.

5. The organic light emitting device of claim 4, wherein a ratio of the FWHM aspect ratio of said one of the convex parts to the aspect ratio of said one of the convex parts is larger than 1.0.

6. The organic light emitting device of claim 1, wherein said one of the convex parts or said one of the concave parts has a hexagonal shape in a plan view having a diameter in a range of 1 to 5 μm and a height in a range of 1 to 4 μm.

7. The organic light emitting device of claim 1, wherein the concave parts or the concave parts are adjacent to each other without a gap therebetween.

8. The organic light emitting device of claim 1, wherein said one of the convex parts or said one of the concave parts has a shape in which a slope increases from an end and then gradually decreases from a maximum slope.

9. The organic light emitting device of claim 8, wherein the maximum slope of said one of the convex parts or said one of the concave parts ranges from 40 degrees to 60 degrees.

10. The organic light emitting device of claim 1, wherein the first electrode, the organic light emitting layer, and the second electrode are disposed along a shape of a top surface of the overcoat layer to have a shape that follows a morphology of the overcoat layer.

11. The organic light emitting device of claim 1, wherein a color filter is disposed between the substrate and the overcoat layer to correspond to a pixel region.

* * * * *